United States Patent [19]

Isaacs

[11] Patent Number: 4,568,929
[45] Date of Patent: Feb. 4, 1986

[54] LIQUID CRYSTAL DISPLAYS FOR TELEPHONE SETS AND OTHER TELECOMMUNICATIONS TERMINALS

[75] Inventor: Robert B. Isaacs, Ottawa, Canada

[73] Assignee: Northern Telecom Limited, Montreal, Canada

[21] Appl. No.: 477,124

[22] Filed: Mar. 21, 1983

[51] Int. Cl.[4] .............................................. G09G 3/02
[52] U.S. Cl. ................................. 340/718; 179/81 C; 179/84 L; 179/99 LS
[58] Field of Search ...................... 340/718, 719, 784; 350/332, 336, 340, 341; 179/81 C, 84 L, 99 LS

[56] References Cited

U.S. PATENT DOCUMENTS 4,352,950 10/1982 Warnecke et al. ............... 179/81 C
4,431,270 2/1984 Funada et al. ...................... 350/332
4,491,692 1/1985 Lee ................................... 179/81 C

FOREIGN PATENT DOCUMENTS 0074226 6/1977 Japan ................................. 340/784

Primary Examiner—Gerald L. Brigance
Assistant Examiner—Jeffery A. Brier
Attorney, Agent, or Firm—Sidney T. Jelly

[57] ABSTRACT

Liquid crystal display (LCD) devices are becoming more widespread in use because of low power requirements, but such devices are expensive to mount singly at present, being restricted for economy reasons to strips of devices. Elastomeric members are also becoming more widespread in use as a switching member in telephone key pads. The present invention provides a simple and inexpensive mounting of LCD devices individually, in association with switching keys. The key is formed by one protrusion on the elastomeric member. The LCD device is mounted in a recess on the top of another protrusion associated with the key protrusion. Conductive paths through the device mounting protrusion connect at their bottom ends with conductive paths and at the top ends with contacts on the LCD device.

6 Claims, 5 Drawing Figures

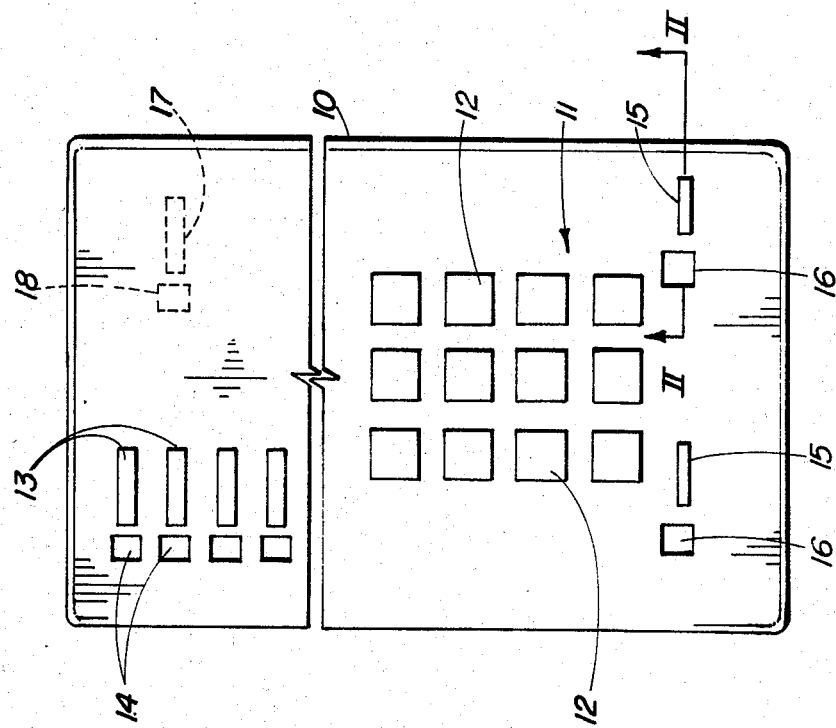

LIQUID CRYSTAL DISPLAYS FOR TELEPHONE SETS AND OTHER TELECOMMUNICATIONS TERMINALS

This invention relates to liquid crystal displays for telephone sets and other telecommunications terminals. In particular the invention relates to a simple and economic mounting of displays individually, whereby the format or pattern of keys can be varied without unreasonable increases in costs.

Liquid crystal displays are becoming more widespread in use in telephone sets, and similar terminals, because of lower power requirements than, for example, light emitting diodes (LEDs), even though LEDs themselves have lower power requirements than filament lamps. However, liquid crystal displays (hereinafter referred to as LCDs) are economic if made in rectangular strips, providing, for example, three or four displays. Individual displays are also quite economical to make, but it has been necessary to provide a mounting member, and sometimes other parts, for each display. By forming a strip with several displays on it, the number of additional parts for mounting is reduced. However, this now restricts the layout of keys with which the displays are associated. Thus, considering as an example, if an economic manufacturing structure is four displays as a strip, then the associated keys are required to be in groups of four, in line.

The present invention enables LCDs to be mounted, individually, very economically. It is becoming conventional to use an elastomeric member as the pushbutton switch member in telephone dial key pads and other key pads. The elastomeric member has protrusions formed therein, a protrusion positioned beneath each key. Pressure on a key depresses the protrusion, the underside moving into contact with contact areas of a circuit pattern on a circuit board. The elastomeric member can be of conducting material, or local areas of conductive material are bonded to the undersurface of the elastomeric member.

In accordance with the present invention protrusions or mounds are formed on an elastomeric member, each mound or protrusion having a recessed top surface in which an LCD is positioned. Conductive paths are formed through the mound from the top surface to the bottom surface of the elastomeric member. Contacts on the LCD make contact with the top end of the conductive paths, while the bottom ends of the conductive paths make contact with conductors on the circuit board.

The invention will be readily understood by the following description of certain embodiments, in conjunction with the accompanying drawings, in which:

FIG. 1 is a plan view of one form of a faceplate for a telephone set;

FIG. 2 is a cross-section on the line II—II of FIG. 1, illustrating the present invention, and to a larger scale;

FIG. 3 is a top view on the mound on the elastomeric member;

FIG. 4 is a top view on the deformable switch member of the elastomeric member; and FIG. 5 is a bottom plan view of a LCD for positioning on the mound as in FIGS. 2 and 3.

In the faceplate 10 a variety of key layouts can be provided. In FIG. 1, the main dial pad is indicated generally at 11, individual keys, or pushbuttons being indicated at 12. A series of keys 13 with associated indicators 14, is shown towards the top of the faceplate. These keys may serve a variety of functions. For example they may provide repertory dialing. Further keys 15 and indicators 16 can be provided near the bottom of the faceplate, and further keys can be provided, as exemplified by the dotted outline key 17 and indicator 18.

As stated previously, LCDs are capable of being produced at low cost if approximately square (individual LCDs) or an elongate rectangle (multiple LCDs) provided the length to width ratio is not extreme. However, mounting of LCDs required special parts which makes using individual displays uneconomic. At present multiple displays are used. Such multiple displays result in some restriction in the layout or pattern of the keys. Thus, as seen in FIG. 1, the keys 13 are in one column and therefore the indicators, or displays, 14 are in a column and can readily be provided by four LCD units on one elongate substrate.

However, if individual keys are required, as at 15 in FIG. 1, with individual indicators, or displays 16, then although individual LCD units can be provided, the relative mounting costs increase. If a relatively large number of individual keys or pairs of keys, are required then mounting costs can become a major part of the overall cost.

It is becoming conventional to use a molded elastomeric member for the pushbutton dial of a telephone set, the elastomeric member having hollow, concave, protrusions molded therein. The elastomeric member extends under the keys or pushbuttons, e.g. keys 12 in FIG. 1. with a protrusion under each key. Beneath the elastomeric member is a circuit board on which is a circuit pattern including switch positions, a switch position for each protrusion and associated key. Pressure on a key deforms the protrusion down, into contact with contact areas on the circuit pattern. Either the elastomeric member can be of electrically conductive material, or localized areas of conductive material can be bonded to the elastomeric material.

In the present invention, it is proposed to provide localized mounds or protrusions, which are adjacent any key position where an indication or display is desired. This is illustrated in FIG. 2, which illustrates the application of the invention to, for example, the keys 15 and associated displays 16. While the cross-section of FIG. 2 is for only one of the keys 15 and display 16, it would be the same for the other key 15 and display 16.

In FIG. 2, a circuit board is indicated at 20 and an elastomeric member at 21. The key is seen at 15, and the associated concave protrusion is seen at 22. Contact areas are illustrated at 23 and a conductive layer or member 24 is bonded to the inside surface of the protrusion 22. A faceplate is illustrated at 25 and the bottom of the telephone set at 26. The circuit board 22 is typically supported from the bottom 26 on pillars 27.

The display or indicator 16, in FIG. 1, is also indicated in FIG. 2. The display comprises an LCD 28 which can be viewed through a transparent, or translucent window 29 in the faceplate 25. The LCD is mounted on the top of a mound or protrusion 30 on the elastomeric member 21. The mound 30 is recessed at its top surface and the LCD sits in the recess. Two conductive paths 31 are formed through the mound, as by molding holes through the mound when the elastomeric member is molded. The holes are then filled with an electrically conducting material, usually also elastomeric. The bottom ends of the paths 31 make contact with conductor paths 32 on the circuit board.

FIG. 3 is a view on the top of a mound or protrusion 30, looking down into the recess. The top ends of the conductive paths 31 are seen. FIG. 4 is a view on the top of concave protrusion 22, with the position of the conductive member 24 indicated. FIG. 5 is an underside view of an LCD. The electrodes are indicated at 33 and contact members at 34, the contact members 34 positioned to contact the top ends of the conductive paths 31 when the LCD 28 is nested into the mound.

It will be appreciated that the mounting of the LCD is extremely simple and inexpensive. The LCD can be bonded in place, or can be held by pressure of the faceplate. It therefore becomes extremely inexpensive to position LCD displays wherever desired.

A particular application of the invention is to provide an elastomeric member which extends for all or at least a major part of the faceplate 10. The keys can be positioned wherever it is desired, without the restriction to position them in columns to allow for multiple unit displays. While it is likely that many keys will still be required in columns, many other keys will be required singly, or in rows. When in rows, the distance between displays makes the actual LCD display of somewhat extreme length to width ratio. Thus conventionally the use of mounting members is expensive. However, with the invention individual LCDs can be inexpensively provided for each key.

What is claimed is:

1. A liquid crystal display assembly for telephone sets and other telecommunications terminals, comprising:
   a support member comprising a circuit board;
   a circuit pattern on said circuit board, said circuit pattern including adjacent electrically conductive paths;
   an elastomeric member extending over said circuit board;
   a protrusion extending in said elastomeric member, in a direction away from said circuit board, said protrusion including a recess in a top surface remote from said circuit board;
   electrically conductive paths extending through said protrusion, from said recess to said circuit board, a lower end of each path being in electrical contact with a different one of said adjacent electrically conductive paths on said circuit board;
   a liquid crystal display positioned in said recess, contact areas on the display being in electrical contact with upper ends of the conductive paths extending through said protrusion.

2. A liquid crystal display assembly as claimed in claim 1, including a faceplate extending over said elastomeric member, and a window in said faceplate positioned over said liquid crystal display, for visual indication therethrough.

3. A liquid crystal display assembly for telephone sets and other telecommunications terminals, including top and bottom housings defining an enclosure, comprising:
   a circuit board supported on said bottom housings;
   a circuit pattern on said circuit board, said circuit pattern including two adjacent electrically conductive paths and a switch position comprising a plurality of contact area;
   an elastomeric member extending over said circuit board;
   a first protrusion extending in said elastomeric member, in a direction away from said circuit board, said first protrusion including a recess in a top surface remote from said circuit board, two electrically conductive paths extending through said protrusion from said recess, a lower end of each path being in electrical contact with a different one of said two electrically conductive paths on said circuit board;
   a second protrusion extending in said elastomeric member in a direction away from said circuit board, said second protrusion including an electrically conductive layer on an inner surface of the second protrusion, said second protrusion aligned with said switch position, depression of said second protrusion connecting said contact area;
   a liquid crystal display positioned in said recess in said first protrusion, contact areas on the display being in electrical contact with upper ends of said conductive paths through said first protrusion;
   said top housing extending over said elastomeric member, said second protrusion extending through said top housing, a window in said top housing aligned with said first protrusion.

4. A display assembly as claimed in claim 3, including a plurality of said second protrusions and a plurality of said first protrusions each of said first protrusions associated with a different second protrusion.

5. A display assembly as claimed in claim 3, including a first plurality of said second protrusions, positioned in rows and columns to define a pushbutton key pad, a second plurality of said second protrusions, and a plurality of said first protrusions, each of said first protrusions adjacent to and associated with a different second protrusion in said second plurality of second protrusions, each of said second protrusions extending through said top housing and a window aligned with each of said first protrusions.

6. A display asssembly as claimed in claim 3, said second protrusion being hollow and including a top face spaced from said circuit board, said electrically conductive layer comprising an electrically conductive member on an inner surface of said top face.

* * * * *